(12) United States Patent
Palassis et al.

(10) Patent No.: US 9,170,132 B2
(45) Date of Patent: Oct. 27, 2015

(54) REPLACEABLE PROBE HEAD HAVING AN OPERATIONAL AMPLIFIER

(75) Inventors: Christopher J. Palassis, Yellow Springs, OH (US); Christopher M. Schuyler, Dayton, OH (US)

(73) Assignee: YSI INCORPORATED, Yellow Springs, OH (US)

( * ) Notice: Subject to any disclaimer, the term of this patent is extended or adjusted under 35 U.S.C. 154(b) by 898 days.

(21) Appl. No.: 13/222,435

(22) Filed: Aug. 31, 2011

(65) Prior Publication Data

US 2011/0309823 A1   Dec. 22, 2011

Related U.S. Application Data

(63) Continuation-in-part of application No. 12/774,081, filed on May 5, 2010, now Pat. No. 8,664,938.

(51) Int. Cl.
| | | |
|---|---|---|
| *G01R 1/06* | (2006.01) | |
| *G01D 11/24* | (2006.01) | |
| *G01R 1/067* | (2006.01) | |

(52) U.S. Cl.
CPC .......... *G01D 11/245* (2013.01); *G01R 1/06733* (2013.01)

(58) Field of Classification Search
CPC .................................................. G01D 11/245
USPC ......................................................... 324/149
See application file for complete search history.

(56) References Cited

U.S. PATENT DOCUMENTS

| | | | |
|---|---|---|---|
| 4,152,235 A | 5/1979 | Dobson | |
| 4,413,628 A | 11/1983 | Tamulis | |
| 4,430,080 A | 2/1984 | Pasquini et al. | |
| 4,447,309 A | 5/1984 | Morioka et al. | |
| 4,851,104 A | 7/1989 | Connery et al. | |
| 5,033,297 A | 7/1991 | Gustafson | |
| 5,147,524 A | 9/1992 | Broadley | |
| 5,235,526 A | 8/1993 | Saffell | |
| 5,440,126 A | 8/1995 | Kemsley | |
| 5,539,396 A | 7/1996 | Mori et al. | |
| 5,820,739 A | 10/1998 | Graser et al. | |
| 5,821,405 A | 10/1998 | Dickey et al. | |

(Continued)

FOREIGN PATENT DOCUMENTS

| | | |
|---|---|---|
| DE | 2416939 | 10/1975 |
| EP | 0127958 | 4/1996 |

(Continued)

OTHER PUBLICATIONS

US, Office Action, U.S. Appl. No. 12/774,081 (Nov. 9, 2012).

(Continued)

*Primary Examiner* — Thomas F Valone

(74) *Attorney, Agent, or Firm* — Thompson Hine LLP

(57) ABSTRACT

A detachable, replaceable, and/or disposable probe head connectable to a probe body containing electronics, a probe that includes the probe head and the probe body, and the combination of a sonde and the probe are described herein. The probe head includes a housing that has a coupling member for detachably connecting the housing to the probe body, in particular to the electronics in the probe body. The probe head also includes a sensor and an electrical connector at least partially housed within the housing, and an operational amplifier electrically coupling the sensor to the electrical connector.

20 Claims, 7 Drawing Sheets

(56) References Cited

U.S. PATENT DOCUMENTS

| | | | |
|---|---|---|---|
| 6,111,249 | A | 8/2000 | Garner, III |
| 6,173,600 | B1 | 1/2001 | Harada et al. |
| 6,179,641 | B1 | 1/2001 | Kaneko |
| 6,305,944 | B1 | 10/2001 | Henry et al. |
| 6,370,941 | B2 | 4/2002 | Nakamura et al. |
| 6,405,581 | B1 | 6/2002 | Bruhn |
| 6,423,197 | B1 | 7/2002 | Lenferink et al. |
| 6,535,283 | B1 | 3/2003 | Heffels et al. |
| 6,592,529 | B2 | 7/2003 | Marett |
| 6,677,861 | B1 | 1/2004 | Henry et al. |
| 6,717,302 | B2 | 4/2004 | Kolloff et al. |
| 6,779,383 | B2 | 8/2004 | Lizotte et al. |
| 6,798,347 | B2 | 9/2004 | Henry et al. |
| 6,906,524 | B2 | 6/2005 | Chung et al. |
| 6,928,864 | B1 | 8/2005 | Henry et al. |
| 6,938,506 | B2 | 9/2005 | Henry et al. |
| 6,999,898 | B2 | 2/2006 | King et al. |
| 7,007,541 | B2 | 3/2006 | Henry et al. |
| 7,105,354 | B1 * | 9/2006 | Shimoide et al. .......... 436/164 |
| 7,138,926 | B2 | 11/2006 | Henry et al. |
| 7,196,524 | B2 | 3/2007 | Wittmer et al. |
| 7,215,420 | B2 | 5/2007 | Gellerman et al. |
| 7,832,295 | B2 | 11/2010 | Rodriguez et al. |
| 8,147,667 | B2 | 4/2012 | Robison |
| 8,470,163 | B2 | 6/2013 | Robison |
| 2002/0148737 | A1 | 10/2002 | Haaf |
| 2003/0117623 | A1 | 6/2003 | Tokhtuev et al. |
| 2003/0148636 | A1 | 8/2003 | Henry et al. |
| 2004/0130714 | A1 | 7/2004 | Gellerman et al. |
| 2005/0148091 | A1 * | 7/2005 | Kitaguchi et al. .......... 436/164 |
| 2007/0139039 | A1 | 6/2007 | Steinich |
| 2008/0141797 | A1 | 6/2008 | Rodriguez |
| 2008/0306380 | A1 | 12/2008 | Parchak et al. |
| 2010/0321046 | A1 | 12/2010 | Randall et al. |
| 2011/0023586 | A1 | 2/2011 | Leyer et al. |
| 2011/0271518 | A1 | 11/2011 | Metzger |
| 2011/0309823 | A1 | 12/2011 | Palassis et al. |

FOREIGN PATENT DOCUMENTS

| | | |
|---|---|---|
| EP | 2133687 | 12/2009 |
| JP | H11-101769 | 4/1999 |
| JP | 2000-123922 | 4/2000 |
| JP | 2008-157950 | 7/2008 |
| WO | 00/61007 | 10/2000 |
| WO | 2006/047899 | 5/2006 |
| WO | 2009/111090 | 9/2009 |

OTHER PUBLICATIONS

Excerpts from "6000 UPG Multi-Parameter Water Quality Monitor Instruction Manuel," YSI Incorporated (34 pages) (Apr. 1997).

Excerpts from "DataSonde® 4 and Minisonde® Water Quality Multiprobes User's Manual," Hydrolab Corporation (3 pages) (Apr. 1998).

"Field Operation Guide YSI 610 Display/Logger," YSI Incorporated (Aug. 1998).

PCT, International Search Report and Written Opinion, International Application No. PCT/US2011/032943 (Dec. 30, 2011).

PCT, International Search Report and Written Opinion, International Application No. PCT/US2012/052453 (Jun. 5, 2013).

Notice of Allowance, U.S. Appl. No. 12/774,081 (Oct. 21, 2013).

JP, Office Action (with English translation) issued Feb. 3, 2015 regarding Japanese Patent Application No. 2013-509092.

US, Office Action issued Feb. 9, 2015 regarding U.S. Appl. No. 14/160,058.

"Troll 9500 Multiparameter Sonde," from the web page of In-Situ Inc., https://in-situ.com/products/multiparameter-meter-sondes/troll-9500-multiparameter-sonde/ (retrieved from the internet on May 4, 2015).

U.S. Appl. No. 14/160,058, Office Action issued Jun. 19, 2014.

* cited by examiner

REPLACEABLE PROBE HEAD HAVING AN OPERATIONAL AMPLIFIER

RELATED CASES

This application is a continuation-in-part of U.S. application Ser. No. 12/774,081, filed May 5, 2010.

TECHNICAL FIELD

The present application relates to a replaceable probe head, and more particularly to a replaceable probe head having a sensor, such as an electrode, and having a connector for sealably connecting the probe head to a probe body and an operational amplifier.

BACKGROUND

Probes having sensors are known, but in the past once the sensor dies, in particular when a fluid reservoir of an electrode type sensor is spent, the entire probe was discarded. That may not have been too expensive prior to "smart probes," but now that probes, like those disclosed herein, carry an on-board circuit board with memory and numerous other functionalities, it is expensive to just throw away the entire probe.

To solve this problem and address this long-felt need, Applicants developed a replaceable probe head that allows the body of the probe housing the more expensive circuit board and/or other electronics to be reused. In the embodiments disclosed herein, only the probe head is discarded. The probe head and probe body when connected to one another define a probe for sensing parameters of an environment. In particular, the probes are intended for use underwater, even to depths of 300-400 meters. The probe's housing is preferably watertight to protect the circuitry connected to the sensor.

Since the replaceable probe head is removeably connectable to the probe body, the potential for water to have access to the connection between the two is increased. It was observed that when water was present at the probe head to probe body connection that the current flow between the replaceable probe head and the probe body experience low impedance, which created detrimental shifts in the sensor readings. Applicants have found that the addition of an operational amplifier within the probe head between the working electrode and the electrical connector successfully electrically isolates the high impedance signals in the probe head from the low impedance interconnect and provides stable sensor readings to the circuit board in the probe body.

SUMMARY

One aspect of the invention, as just discussed above, is a replaceable and/or disposable probe head that includes a working electrode, an electrical connector for connection to the circuit board within a probe body, and an operational amplifier between the working electrode and the connector. The operational amplifier electrically isolates the high impedance signals in the probe head from the low impedance interconnect, which may result from the presence of water at the connector of the probe head or the connector of the probe body, and provides stable sensor readings to the circuit board in the probe body. More specifically, the probe head includes a housing that encloses at least part of a sensor that includes the working electrode, and at least part of the electrical connector, which is electrically coupled to the sensor. When the probe head is detachably connected to the probe body, the electrical connector will electrically couple the sensor to the electronics in the probe body. To form the detachable connection, the housing includes a coupling member positioned to detachably connect the housing to the probe body. The coupling member may be a flexible open ring having a snap-fit feature, for example, an annular ridge protruding from the exterior surface of the open ring for coupling the probe head to the probe body. The open ring is compressible toward a closed ring position to couple the probe head to the probe body, expands to interconnect the two, and is compressible again to uncouple the probe head.

In one embodiment, the sensor includes a first working electrode and a reference electrode. The working electrode generates and transmits a raw signal representative of the working electrode's reading to the operational amplifier, which is operating as a voltage follower to buffer the raw signal. In one embodiment, a pH electrode is the working electrode electrically connected to the operational amplifier; thus, the raw signal representative of the sensor reading is a raw pH reading.

In another embodiment, the probe head includes a second working electrode. The second working electrode is electrically coupled directly to the electrical connector to pass the raw signal representative of the second working electrode's reading to the electronics of the probe body.

In another aspect, a probe for monitoring a parameter of an environment is disclosed that includes a probe head and a probe body. The probe head may be or is similar to the probe head described above and includes an operational amplifier and a second electrical connector. The probe body encloses electronics that are electrically coupled to a first electrical connector, which is electrically connectable to the second electrical connector to electrically couple the sensor of the probe head to the electronics of the probe body.

In another aspect, disclosed herein is an apparatus that includes a sonde operatively connected to a probe that includes a replaceable probe head, in particular, with the electronics of the probe body and, hence, the sensor in the replaceable probe head.

DETAILED DESCRIPTION

Figure 1:
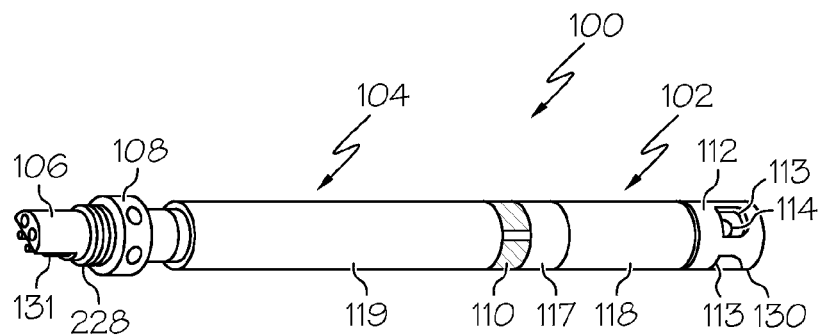
FIG. 1 is a side view of one embodiment of a probe having a replaceable probe head.

The following detailed description will illustrate the general principles of the invention, examples of which are additionally illustrated in the accompanying drawings. In the drawings, like reference numbers indicate identical or functionally similar elements.

Referring to FIG. 1, a probe, generally designated 100, is shown that has a distal end 130 and a proximal end 131 and may include a removable probe head 102 removeably coupled to a probe body 104 by a coupling member 110, a connector 106, a connecting collar 108, and a guard 112 having one or more windows 113. The probe 100 can monitor parameters of an environment using a sensor 114 housed within the probe head 102, typically an environment surrounding the distal end 130 of the probe, i.e., the probe head, when connected to another device by connector 106 and, optionally, by the connecting collar 108. The connecting collar 108 may be threaded for connecting the probe to a port in the device. The connector 106 may include a stop ring 228 to retain the collar 108, i.e., to keep the collar from sliding off.

Figure 14:
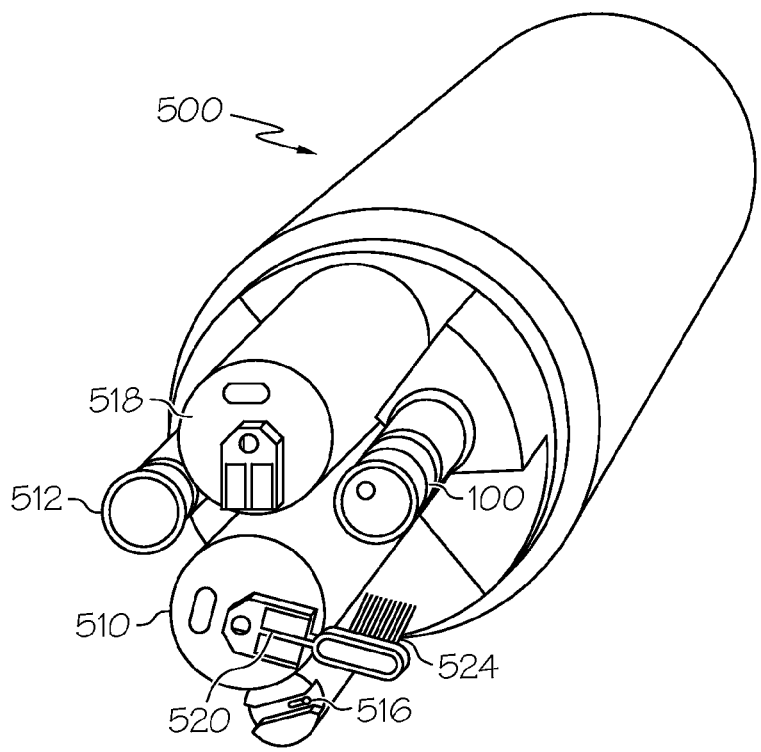
FIG. 14 is a top perspective view of a sonde that includes the probe of FIG. 1.

Referring to FIG. 14, in one embodiment, the probe 100 may be connected to a sonde 500, like the sonde described in U.S. Pat. No. 6,779,383, modified to include the probe disclosed herein. The sonde 500 includes a plurality of probes having various sensing capabilities. For example, the sonde 500 may include a turbidity sensor 510, a dissolved oxygen sensor 512, the probe 100 having the replaceable probe head that in one embodiment includes a pH electrode and/or an ORP electrode, a temperature-conductivity sensor 516 and a sensor 518, which can be a chlorophyll or rhodamine sensor. The sonde 500 may also include a wiper element 520 about which a wiper media such as a foamed rubber wiper pad is wrapped and extending therefrom beyond the diameter of the sensor it is mounted on, the turbidity sensor 510 in FIG. 14 is a brush 524 for cleaning the surface of the sensors. In another embodiment, the probe 100 may be connected to a sensor adaptor, a datalogger, a computer, a handheld monitoring unit, or any other mobile or fixed data collection platform capable of connecting to the probe and communicating with the sensor therein to monitor the environment surrounding the sensor.

The probe 100 includes a sensor 114 housed within the housing 118 that defines at least part of the replaceable probe head 102. The sensor 114 has access to the environment surrounding the distal end 130 of the probe 100. In one embodiment, like that in FIG. 1, the sensor 114 may protrude from housing 118 and be surrounded by the guard 112. The replaceable probe head 102 may include a housing 118, which may be a hollow, generally cylindrical tube, with a sleeve 117 fixedly attached to one end thereof. The replaceable probe head 102 may also include a coupling member 110 positioned on the sleeve opposite the distal end 130. The coupling member removeably couples the replaceable probe head 102 to the probe body 104, in particular to second housing 119.

The replaceable probe head 102, in particular its housing 118, sleeve 117, and guard 112 may be a plastic material such as a suitable engineering thermoplastic material with good material strength that lends itself to having the windows 113, the tabs 129, 129', slots 182, 182' and/or annular grooves 116, 120, 122, described below, formed therein. The thermoplastic may be water, corrosion, and/or chemically resistant, and electrically insulating. The plastic material should also be suitable for forming a watertight housing, in particular, having watertight bands between adjoining pieces. The watertight bond is important since the replaceable probe head 102 is often used under water at significant depths and experiences increased pressure as it descends. If a gap occurs, water may be able to enter the replaceable probe head 102 and damage its components.

The thermoplastic material may be an acetal, acrylic, acrylonitrile-butadiene-styrene terpolymer, a polyamide, a polycarbonate, a polyetherimide, a polyphenylene ether, a polyphenylene sulfide, a polysulfone, polyvinyl alcohol, or a thermoplastic polyester. In one embodiment, the thermoplastic material is an imide; preferably a non-filled imide, such as a polyetherimide. Polyetherimides are commercially available under the brand name Ultem® available from SABIC Innovative Plastics.

Figure 2:
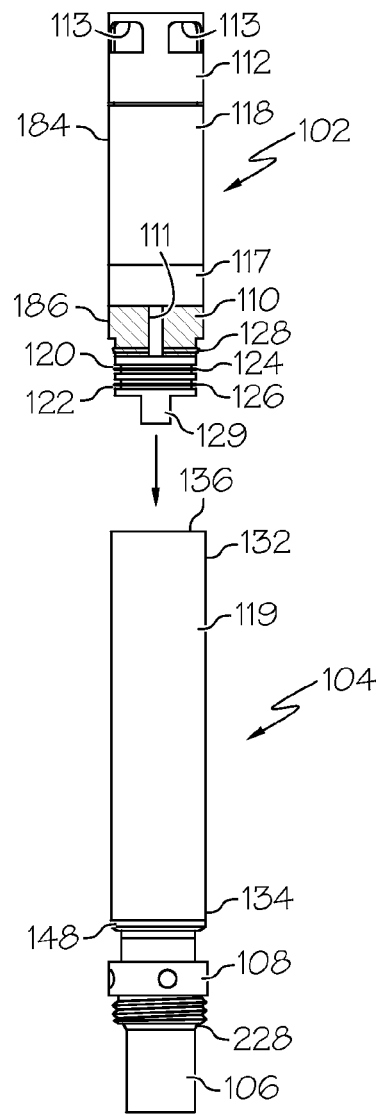
FIG. 2 is an exploded assembly view of the probe of FIG. 1.

As shown in the assembly view of FIG. 2, the replaceable probe head 102 may be inserted into the probe body 104, preferably using linear force, to couple the replaceable probe head 102 to the probe body 104 with a watertight seal. The replaceable probe head 102 may need to be partially inserted into the probe body 104 and rotated to align means to key the replaceable probe head 102 to the probe body 104 for a proper connection before applying further force to push the replaceable probe head 102 into the probe body 104. The replaceable probe head 102 is removeably coupled to the probe body 104 by the coupling member 110 and may be removed by activating (e.g., compressing) the coupling member 110 and pulling with a linear force opposite of the force used to insert the replaceable probe head 102.

Now referring to FIGS. 1-4, the replaceable probe head 102 has a first end 184 and a second end 186, a housing 118 that houses a sensor 114 and at least part of an electrical connector 171 electrically coupled to the sensor 114, a coupling member 110 positioned to detachably connect the housing 118 to the probe body 104, and a guard 112 to protect the first end 184 where a portion of the sensor 114 may be positioned. In one embodiment, the housing 118 may be a monolithic body having the coupling member 110 integrally formed therewith or as a separate component. In another embodiment, the housing 118 may include a sleeve 117, which may have the coupling member, again, integrally formed therewith or as a separate component.

Figure 3:
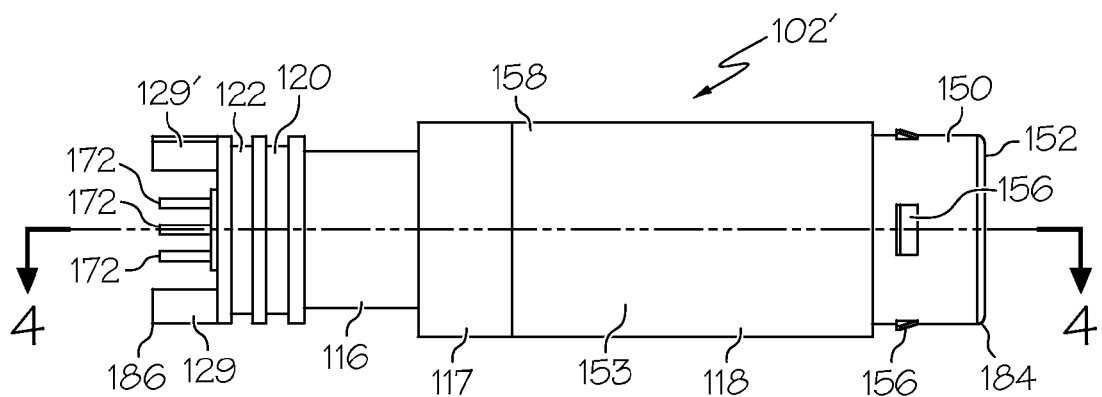
FIG. 3 is a side view of the replaceable probe head without the retaining clip.
Figure 4:
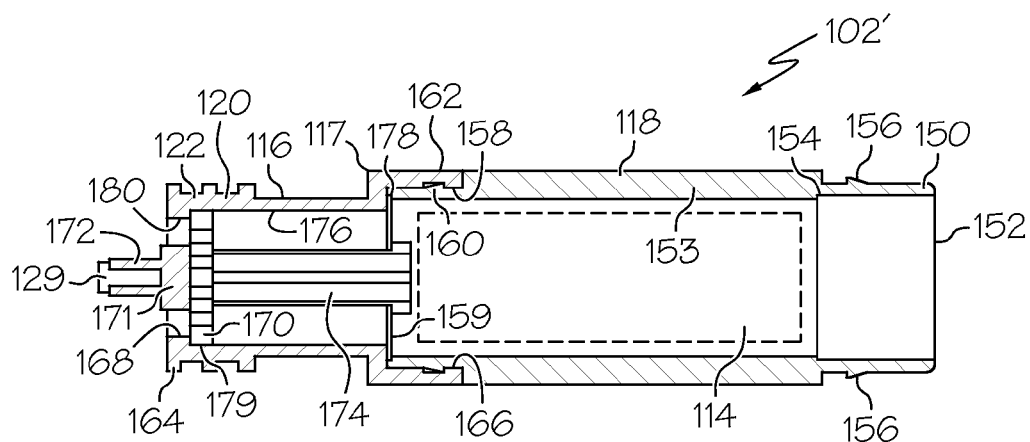
FIG. 4 is a cross-sectional view of the replaceable probe head of FIG. 3 taken along line 4-4.

The housing 118, best seen in FIGS. 3-4, has a first end 150 and a second end 158 and may be a generally cylindrical, hollow housing. The first end 150 defines a first opening 152 that may include one or more ports 199 (FIG. 10) and includes a first connecting means 156 on its exterior surface proximate to the first opening. The first connecting means 156 may be continuous or discontinuous protuberances such as clips, snap-fit feature(s), threading, or other connecting features that can fixedly attach the guard 112 to the housing 118. The first end 150 may have a smaller outer diameter than the central section 153 of the housing, which facilitates the guard 112 fitting over the first end 150. In an alternate embodiment, the protuberances may be on the interior of the guard 112 and the first end 150 will, instead, have appropriately positioned and shaped recesses proximate to the first opening 152. The first end 150 may also have a smaller inner diameter than the central section of the housing 118 such that an annular shoulder 154 is formed where the first end 150 transitions to the central section of the housing. The annular shoulder 154 may be used to mount one or more sensors 114 within the first end 150 of the housing. In another embodiment, the guard 112 could fit inside the first end 150 rather than over it, and both components would be shaped and configured accordingly.

The guard 112, as described above, is fixedly attachable to the first end 150 of the housing 118 of the replaceable probe head. The guard includes one or more windows 113 in the distal end of the guard 112. The guard 112 may be a generally cylindrical, hollow sleeve that fits at least partially over the first end 150 of the housing 118 to position the one or more windows 113 where the environment surrounding the guard 112 has access to the sensor 114 or electrode 114' (FIG. 10) of the replaceable probe head 102.

The second end 158 of the first housing 118 defines an opening 159 in the second end and includes a second connecting means 160 on its exterior surface proximate to the opening 159. The second connecting means 160 may be any of the same connecting means discussed above for the first connecting means 156 and may be the same or different as the first connecting means 156 on the housing 118. The second end 158 may have a smaller outer diameter than the central section of the housing 118, which facilitates the second end 158 receiving the sleeve 117. The outer diameter of the second end 158 may be the same as the outer diameter of the first end 150 of the housing, but is not limited thereto. In another embodiment, the sleeve 117 could fit inside the second end 158, and both components would be shaped and configured accordingly.

The sleeve 117 has a distal end 162 and a proximal end 164. The distal end 162 defines a first opening 166 that has a larger inner diameter than the central section 176 of the sleeve 117. A first annular step 178 is formed in the interior of the sleeve 117 where the distal end 162 transitions to the central section 176. The first annular step 178 acts as a stop or seat for the second end 158 of the housing 118 when it is inserted into the open first end 166 of the sleeve 117. The distal end 162 may include an annular groove or appropriately shaped and position recesses just interior to the first end 166 indented into the wall thereof. The groove or recesses are to receive the connecting means 160 of the second end 158 of the first housing 118 for a watertight connection. The sleeve 117 and housing 118 are preferably fixedly attached together. In an alternate embodiment, the sleeve 117 may be integral with the housing 118. If so, the second connecting means 160 would be absent.

The exterior of sleeve 117 may include one or more annular groves 116, 120, 122 indented therein. A first annular groove 116 may be positioned most proximate to the housing 118 and may be wide enough to receive the coupling member 110. The sleeve 117 may include a second annular groove 120 between the first annular groove 116 and the proximal end 164 of the sleeve. The second annular groove 120 may be shaped to receive a first sealing member 124, for example, an O-ring or the like. In another embodiment, there may be a third annular groove 122 between the second annular groove 120 and the proximal end 164 of the sleeve 117 that is shaped to receive a second sealing member 126. While the embodiments herein have three annular grooves with two of the grooves for receiving sealing members, one of skill in the art will appreciate that any number of grooves and sealing members may be used. The sealing members 124, 126 (FIG. 2) provide a watertight seal between the replaceable probe head 102 and the probe body 104.

The proximal end 164 of the sleeve 117 defines a second opening 168 that has a smaller inner diameter than the central section 176 of the sleeve 117. As such, a second annular step 179 is formed in the interior of the sleeve 117 at the transition of the central section 176 to the second opening 168. The second annular step 179 has seated thereon a circuit board 170, such as a printed circuit board, that has an electrical connector 171 extending from the circuit board 170 into or through the second opening 168. The electrical connector 171 may be a header with either pins or sockets extending from the second opening 168, a card edge connector, a printed circuit board connector, a USB connector, or any other known or later-developed connector that can connect the sensor 114 or electrode 114' to the circuit or circuit board 170 housed within the probe body 104. In the embodiment in FIGS. 3-6, the electrical connector 171 is a male header with at least one active pin. One of skill in the art will appreciate that not all the pins on a header need be connected to the circuit board 170 on the opposite side of the header. While the header shown has six pins, the electrical connector is not limited thereto.

The circuit board 170 may be adhered to the sleeve 117 to hold it in place and to form a watertight seal. Filler 180 may be present between the electrical connector 171 and the second opening 168. Suitable filler 180 seals the second opening 168 of the sleeve 117 so that water cannot enter and damage the components of the connector 171, the circuit board 170, or the sensor 114. The filler 180 may be an adhesive, polymer, or other resin that provides a watertight protective seal of the open second end 168. For example, filler 180 may be an epoxy resin, silicone RTV, potting compound, or any other suitable filler for forming a watertight seal. Connected to the circuit board 170 opposite the electrical connector 171 is at least one lead 174 that extends through the sleeve 117 into housing 118 and connects the sensor 114 and/or its components to the electrical connector 171.

Figure 5:
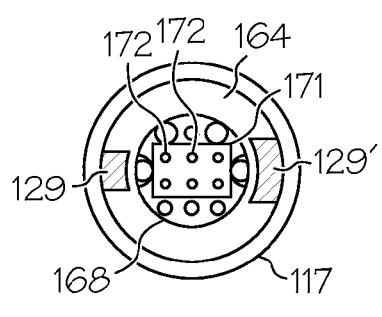
FIGS. 5-6 are connector end views of alternate embodiments of the replaceable probe head.
Figure 6:
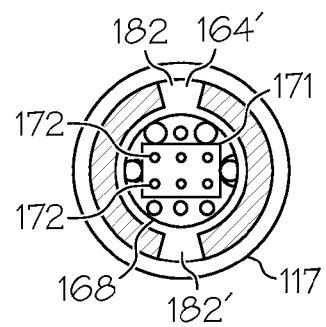
Figure 11:
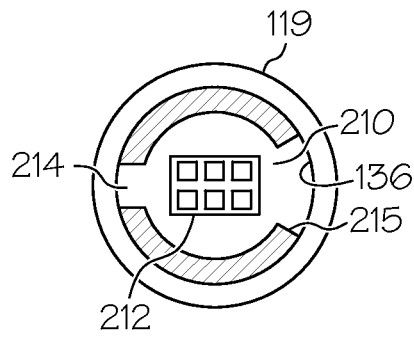
FIGS. 11-12 are distal end views of alternate embodiments of the probe body.
Figure 12:
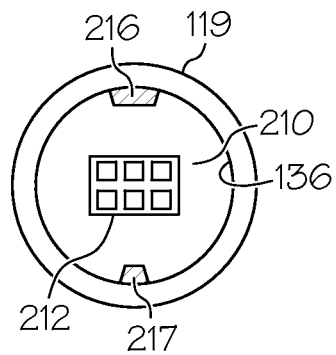

The proximal end 164 of the sleeve 117 may also include a means to key the replaceable probe head 102 to the probe body 104. In the embodiment of FIGS. 3-5, the means to key the replaceable probe head 102 is one or more tabs 129, 129' extending longitudinally from the proximal end 164 of the sleeve 117. The first tab 129 and the second tab 129' may have different shapes as shown in FIG. 5, such that there is only one orientation for insertion of the replaceable probe head 102 into the probe body 104 to correctly connect the electrical connector 171 to the circuit board 170 in the probe body 104. Accordingly, as seen in FIG. 11, the first opening 136 of the probe body 104 receiving the electrical connector 171 has a first slot 214 configured to receive the first tab 129 and a second slot 215 configured to receive the second tab 129'. In the embodiment of FIG. 6, the means to key the replaceable probe head 102 may be one or more slots 182, 182' cut into the proximal end 164' of the sleeve 117, with the slots preferably having different shapes. Accordingly, as seen in FIG. 12, the first opening 136 of the probe body 104 receiving the electrical connector 171 has a first tab 216 and a second tab 217 configured to be received in the slots 182, 182', respectively, of the replaceable probe head 102. Many other means to key two parts together are known and are equally applicable here. For example, the proximal end 164 of the sleeve 117 may have a protrusion on the outer surface thereof that fits into a slot indented and running longitudinally down the interior wall of the end of the probe body 104 receiving the sleeve 117.

The sensor 114 housed within the replaceable probe head 102 may include a plurality of components, including an electrode 114' (FIG. 10), window, membrane, or other surface positioned in or extending from the first end 150 of the housing 118, preferably in or extending from a port 199 in the first end 150. The electrode 114' may be an ion-selective electrode. Any suitable ion-selective electrode or a combination of such electrodes may be housed by the probe head 102. For example, a pH electrode, oxidation-reduction potential electrode, a dissolved oxygen electrode, an electrode selective toward nitrite ions, nitrate ions, ammonia, fluoride ions, sodium ions, chloride ions, potassium ions, calcium ions, bromide ions, or manganese(II) ions. In one embodiment, the probe head 102 houses a pH electrode. In another embodiment, the probe head 102 houses an oxidation reduction potential electrode. In yet another embodiment, the probe head 102 houses both a pH electrode and an oxidation-reduction potential electrode.

Figure 10:
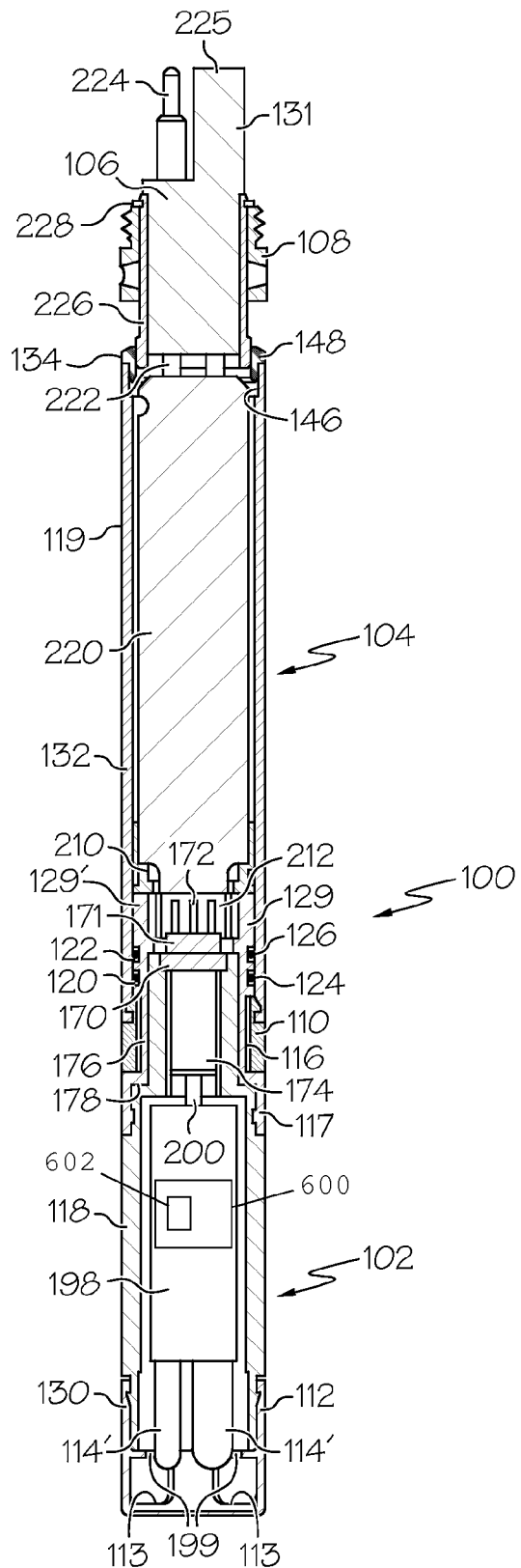
FIG. 10 is a cross-sectional view of the probe of FIG. 1.

An embodiment of a probe 100 having two sensors, in particular two electrodes 114' extending from the first end 150 of housing 118, is represented in FIG. 10. The electrodes 114' have their sensor components 198 housed within housing 118 and connected to electrical leads 174 by a sensor connector 200, for example, or electrical lead. The sensor components 198 are those typically needed for the particular sensor or electrode chosen for the parameter to be monitored. For a pH electrode, the sensor components 198 may include a sensor reservoir containing a reagent that is consumed in making measurements with the sensor, for example, an electrolyte filling solution such as KCl, a pH glass electrode in fluid communication with the reservoir, a wire such as a pure silver wire dipped in silver chloride to pass the signal from the solution to the sensor connector 200, and a reference electrode, either separate or built into the pH electrode itself. For an oxidation-reduction potential electrode, the sensor components 198 may include similar components to the pH electrode such as the pure silver wire dipped in silver chloride surrounded by a reservoir containing an electrolyte filling solution such as KCl, except that a nobel metal such as platinum, gold, or silver is used as the measuring element rather than pH glass. The sensor components 198 for other types of electrodes or sensors are known and may be housed within housing 118, which is watertight and/or liquid-tight to protect the sensor components 198.

In one embodiment, the sensor components 198, represented in FIG. 10, include a sensor interface circuit 600 that has an operational amplifier 602. The sensor interface circuit 600 is coupled to at least one electrode 114' that is partially housed within the probe head 102. Accordingly, the electrode 114' can transmit a raw signal 604 representative of a sensor reading to the operational amplifier 602. As shown in the circuit diagram in FIG. 16, the operational amplifier 602 has a voltage follower portion 606 that receives the raw signal 604 and buffers the signal to eliminate loading effects and any detrimental shifts that are present without an operational amplifier. In one embodiment, the raw signal 604 may pass through a resistor $R_1$ before entering the operational amplifier 602. The amplified signal output 605 is transmitted from the operational amplifier 602 through the electrical connector 212, i.e., through a first pin $P_1$, to the printed circuit board 220 in the probe body 104 for processing. In one embodiment, the raw signal 604 is from a first working electrode 613.

As used herein, "raw signal representative of a sensor reading" means a signal from a working electrode, not from a reference electrode. The raw signal representative of a sensor reading may be a raw signal from an ion-selective electrode, such as an electrode that has or includes a working electrode not in direct contact with the water (i.e., separated by a membrane, etc.), such as those described above. The raw signal is indicative of a reading being taken by the electrode. The raw signal 604 may be a signal that is more susceptible to fluctuations or shifts therein because of the high impedance nature of the measurement.

Figure 16:
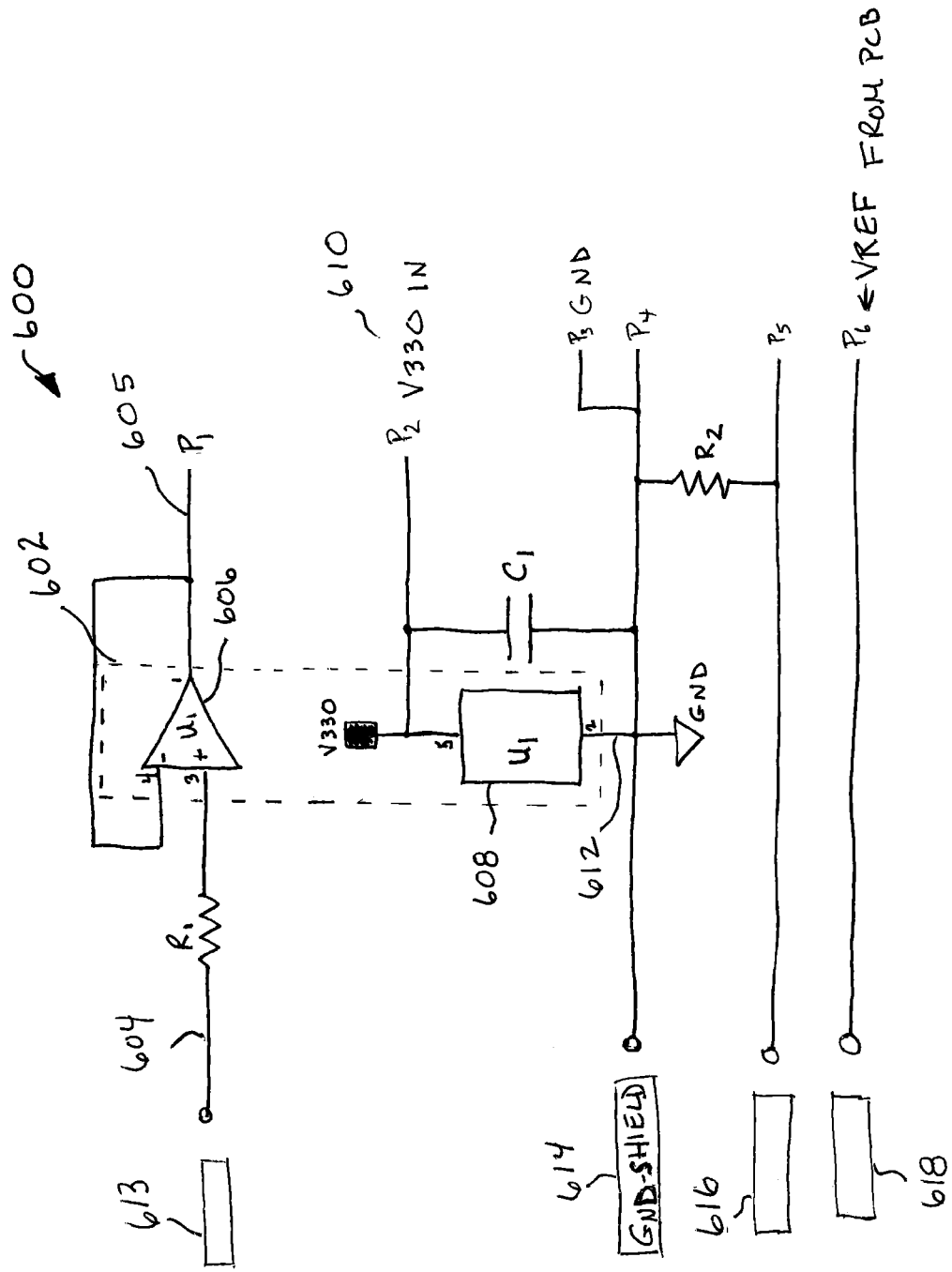
FIG. 16 is a schematic diagram of an operational amplifier and its connections to the other components of a replaceable probe head.

As illustrated in FIG. 16, the operational amplifier 602 also includes an input power portion 608 that is electrically connected to the electrical connector 212, for example to a second pin $P_2$, to receive an input voltage 610. The input power portion 608 also has a grounded connection 612 and may include a capacitor $C_1$ between the grounded connection 612 and the input voltage 610. The grounded connection 612, as seen in FIG. 16, is connected to a ground-shield 614 that shields the wires or leads between the working electrode and the operational amplifier 602.

As mentioned above, the operational amplifier 602 is connected to the electrical connector 212, which is a multi-pin connector. Still referring to FIG. 16, a first pin $P_1$ of the electric connector 212 is electrically connected to the amplified output 605 of the voltage follower 606. A second pin $P_2$ is electrically connected to a power source, i.e., voltage in. Third and fourth pins $P_3$ and $P_4$ (and any other unused pins) of the multi-pin connector are grounded. A fifth pin $P_5$ may be directly connected to a second working electrode 616, if one is present, as a pass through to the electronics 220 in the probe body 104 (see FIG. 10). A sixth pin $P_6$ is electrically connected to a reference electrode 618 and transmits a voltage reference (VREF) signal from the electronics 220 in the probe body 104 to the reference electrode 618 in the probe head 102. This establishes a known voltage value as the standard value for the reference electrode 618, which will be used by a processor in the electronics 220 of the probe body 104 or a processor in a sonde to calculate the sensor reading and convert it, if needed, to a form that is understandable by a user.

While pins $P_1$ to $P_6$ are illustrated in FIG. 16, the multi-pin connector is not limited to having six pins or to the specific configuration shown. Any pin may be used for connection to power, ground, the operational amplifier, etc. Additional resistors such as $R_2$ may be included in the sensor interface circuit 600 as needed for proper functionality and longevity of the circuitry.

In one embodiment, the second working electrode 616 is present and is electrically connected to the fifth pin P5 of the multi-pin connector 212 as a pass through to the electronics 220 of the probe body 104. The first working electrode 613 may be a pH electrode and the second working electrode 616 may be an oxidation-reduction potential electrode.

Figure 7:
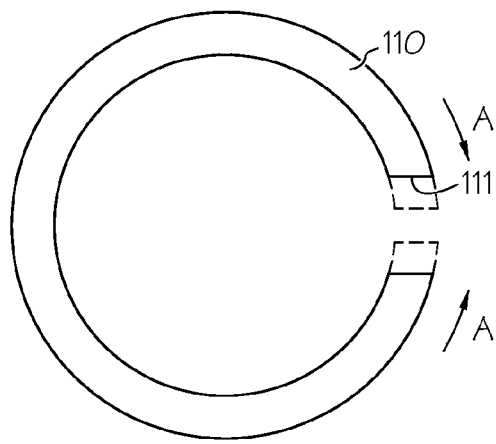
FIG. 7 is a top view of the retaining clip of the replaceable probe head.
Figure 8:
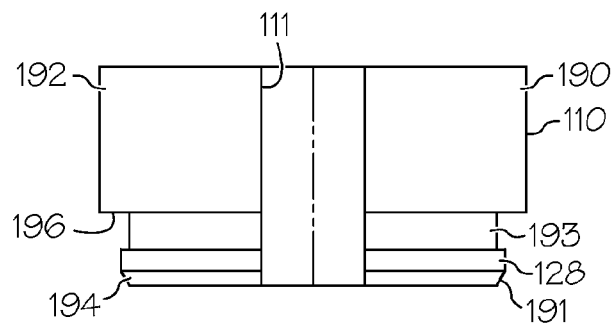
FIG. 8 is a front view of the retaining clip of FIG. 7.

Referring now to FIGS. 7-8, the coupling member 110 is described in detail. The coupling member 110 may be any connecting feature that allows the mating of the probe head 102 and the probe body 104 and the mating of their respective electrical connectors 171, 212 with a detachable, watertight connection. In the embodiment in FIGS. 7-8, the coupling member 110 is a flexible open ring 110 having a slot 111. In one embodiment, the open ring 110 is generally C-shaped. The flexibility of the ring 110 and slot 111 render the open ring 110 compressible or pinchable at least to the extent that the slot 111 may be closed when pressure is applied to the ring 110 on both sides of the slot 111 and will return to its original position when the pressure is removed. Accordingly, the open ring 110 is compressible or pinchable toward a closed ring position as shown by arrows A in FIG. 7. The open ring 110 may also be expandable such that it may be expanded to widen slot 111, in particular, so that the open ring 110 may be slid over the sleeve 117 and into the first annular groove 116.

The exterior of the coupling member 110, best seen in FIG. 8, includes an upper portion 192 defining an open distal end 190 and a lower portion 193 defining an open proximal end 191. The upper portion 192 overall has a larger outer diameter compared to the lower portion 193. An annular stop 196 is defined where the upper portion 192 transitions to the lower portion 193. The lower portion 193 includes a snap fit feature 128. The snap fit feature 128 is generally an annular snap fit feature, as it extends around the outer circumference of the open ring 110. The leading edge 194 of the snap fit feature 128 may be beveled at an angle less than 90° to aide in pushing the snap fit feature 128 into the probe body 104. The snap fit feature 128 is preferably an annular protuberance as shown in FIG. 8, but is not limited thereto. Inside and outside snap fit features and/or other cantilevered snap fit features are all well known and may be applicable here.

An advantage to the open ring 110 is that the replaceable probe head 102 can be removed and replaced easily by anyone. Such components are often referred to as "field replaceable," which eliminates sending the probe to the manufacturer for replacement of the probe head.

The flexible open ring 110 detachably locks the probe head 102 and the probe body 104 together upon insertion. The open ring 110 is compressed during insertion into the probe body 104 and, due to its flexibility, expands outward into engagement with the probe body 104 once inserted. In the embodiment of FIG. 10, the snap-fit feature 128 of the open ring 110 expands into engagement with, for example, an annular groove in the probe body 104. The user may make insertion of the probe head 102 easier by pinching the open ring 110 toward a closed ring position A while inserting or beginning to insert the probe head 102 into the probe body 104.

When the probe head 102 is ready to be replaced (i.e., when an on-board reservoir is used up, the probe head no longer works, etc.), the flexible open ring 110 is pinched toward a closed ring position A by the user to disengage the open ring 110 from the probe body 104. The user may pinch the open ring 110 between the thumb and at least one finger of the same hand. While pinching the open ring 110, the user pulls the probe head 102 and the probe body 104 apart thereby disengaging their respective electrical connectors 171, 212. Now the spent probe head 102 may be discarded and replaced with a new probe head.

Figure 13:
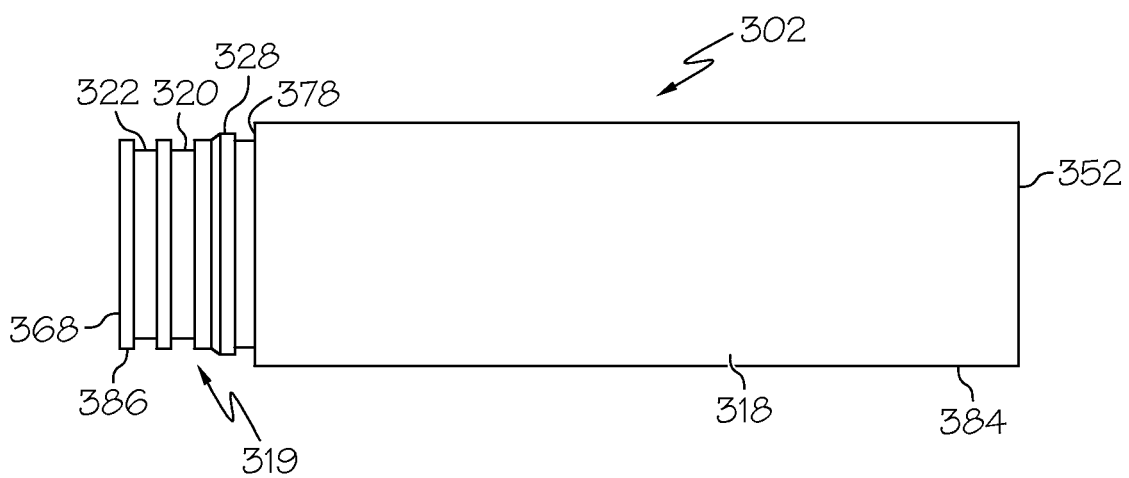
FIG. 13 is a front view of another embodiment of the replaceable probe head.

An alternate embodiment for the coupling member 110 is shown on the replaceable probe head 302 in FIG. 13. The replaceable probe head 302 has an integral housing 318 that has a distal end 384 defining a first opening 352 and a proximal end 386 defining a second opening 368. Here, the annular snap fit feature 328 is integrally formed on a coupling member 319 of the housing 318. The coupling member 319, overall, has a smaller outer diameter than the rest of housing 318, such that an annular step 378 is defined at the transition from the coupling portion 319 to the main body of housing 318. The exterior of coupling member 319 may also include one or more annular groves indented therein. A first annular groove 320 may be between the snap fit feature 328 and the proximal end 386. The first annular groove 320 may be shaped to receive a sealing member, for example, an O-ring or the like. The coupling member 319 may also include a second annular groove 322 between the first annular groove 320 and the proximal end 386 that is also shaped to receive a sealing member. While FIG. 13 illustrates two annular grooves in the coupling portion 319, the embodiment is not limited thereto. This embodiment has an effective coupling mechanism, but the probe head 302 may need to be replaced by the manufacturer or a trained technician.

In another embodiment, the coupling member 110 may be a clip, a push button-receiving aperture connection, threading, or other connecting features that facilitate a detachable connection between the probe head 102 and the probe body 104. These alternate coupling members may be used alone or in combination with the open ring 110 discussed above or with one another. Any of these embodiments may include an O-ring or other sealing member to provide a watertight seal between the probe head 102 and the probe body 104.

Figure 9:
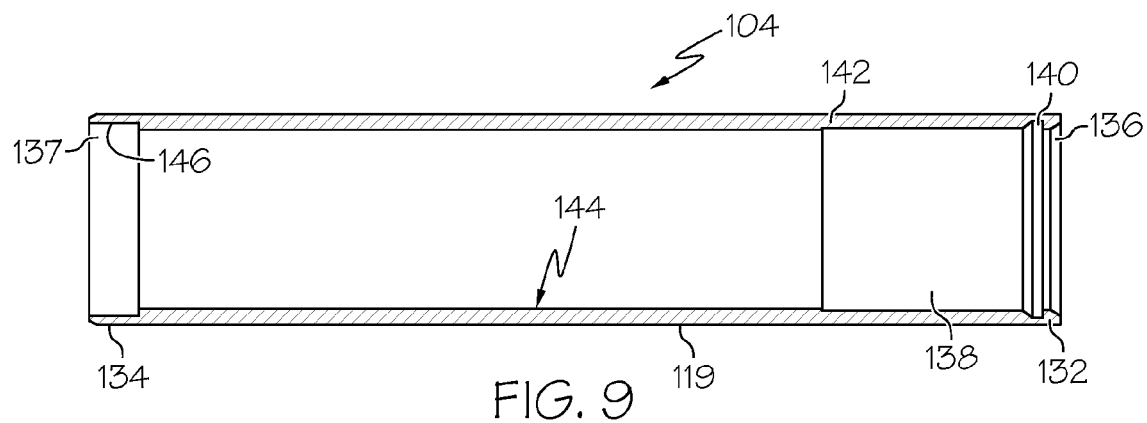
FIG. 9 is a cross-sectional view of the probe body.

Now referring to FIG. 9, the probe body 104 has a second housing 119 that is preferably a hollow, generally cylindrical tube having a distal end 132 and a proximal end 134. The distal end 132 defines a first opening 136 and the proximal end 134 defines a second opening 137. The housing 119 has a substantially uniform outer diameter, but has three internal segments with different inner diameters. The interior of the housing 119 has a cavity 138 at the distal end 132, an enlarged opening 146 at the proximal end 134, and a chamber 144 therebetween.

The cavity 138 has a smaller inner diameter than the chamber 144 such that an annular shoulder 142 is defined at the transition between the cavity 138 and the chamber 144. The cavity 138 is generally sized to receive the second end 186 of the replaceable probe head 102 including the snap fit feature 128 of the coupling member 110. Just interior to the first opening 136 is an annular groove 140 indented into the wall of the cavity and extending around its periphery. The annular groove 140 is shaped and positioned so as to receive the snap fit feature 128 protruding from the coupling member 110 when the replaceable probe head 102 is connected to the probe body 104. It is appreciated that, while an annular groove is preferable, other indentation means are also possible. For example, the other indentation means may include a plurality of recesses formed in the cavity's wall arranged to coincide in alignment with a plurality of protuberances on the second end 186 of the replaceable probe head 102.

The enlarged opening 146 at the proximal end 134 of the second housing 119 extends generally uniformly into the interior of the housing 119 and is contiguous with the second opening 137 defined by the proximal end 134. The enlarged opening 146 has a larger inner diameter compared to the chamber 144 and may even have a larger inner diameter compared to the cavity 138. The benefits of the enlarged opening 146, in particular, in relation to assembling and welding the assembly, are explained in Applicants' U.S. patent application Ser. No. 12/773,995 PROBE AND PROCESS OF ASSEMBLING SAID PROBE (the "Assembly Process application"), filed the same day as this application, and incorporated herein by reference in its entirety.

The second housing 119 may be a metal and/or an anti-biofouling material. The metal may be water resistant and corrosive resistant. For example, the second housing 119 may be titanium, stainless steel, nickel, copper, and alloys thereof. In one embodiment, the second housing 119 is titanium. In another embodiment, the second housing 119 is an antifouling copper-nickel alloy with a high copper content. For example, the antifouling copper-nickel alloy may be a 90-10 CuNi alloy or a 70-30 CuNi alloy. In another embodiment, the housing may be an antifouling plastic, for example, a polyethylene, polypropylene, or nylon that may include an anti-fouling compound such as capsaicin, capsicum, furan compounds, copper compounds, lactones, alkyl-phenols, organotin compounds, antibiotics, or mixtures thereof.

Now referring to FIG. 10, which is a cross-section of the embodiment in FIG. 1, the probe 100 includes the features of the replaceable probe head 102 discussed above including the open ring as the coupling member 110 and a probe body 104 with housing 119 housing a circuit board 220, such as a printed circuit board. The circuit board 220 is mainly housed in chamber 144 and is connected to a platform 210 having a second electrical connector 212 extending therethrough. The platform 210 is seated on the annular shoulder 142, preferably the platform 210 is adhered thereto with a watertight seal, for example with an epoxy adhesive. The platform 210 and the second connector 212 are also shown in the end views of FIGS. 11-12 looking down into cavity 138 of the second housing 119 from the first opening 136.

The second electrical connector 212 may be the same as the first electrical connector 171 described above, but of a configuration that will mate with the first electrical connector 171. As shown in FIG. 10, the first connector 171 is a male header with six pins and the second electrical connector 212 is a female header with six receptacles receiving the pins.

Connector 106 is connected to the circuit board 220 at the end opposite of the platform 210 by leads 222. The connector 106 includes at least one male pin 224 and at least one female receptacle 225. Preferably, the male pin 224 and female receptacle 225 are wet mateable connectors. Connector 106 may also include a casing 226 surrounding at least part thereof, preferably, surrounding the part adjacent to the proximal end 134 of second housing 119 to provide a surface for affixing the connector 106 to the proximal end 134 with a watertight seal. The casing 226 may be a metal and/or an anti-biofouling material such as those discussed above for the second housing 119. In one embodiment, the second housing 119 and the casing 226 are composed of the same material and may be fixedly attached to one another, for example by laser welding as disclosed in the Weld Method application. To enhance the attachment between the second housing 119 and the casing 226, a reducing ring 148 may be inserted into the enlarged opening 146 of the second housing 119 to provide increased surface area for the weld.

Connector 106 may include a collar 108 on the casing 226 that is retained on the casing 226 by a stop ring 228 that fits within an annular groove indented into the end of the casing 226 opposite the second housing 119.

Figure 15:
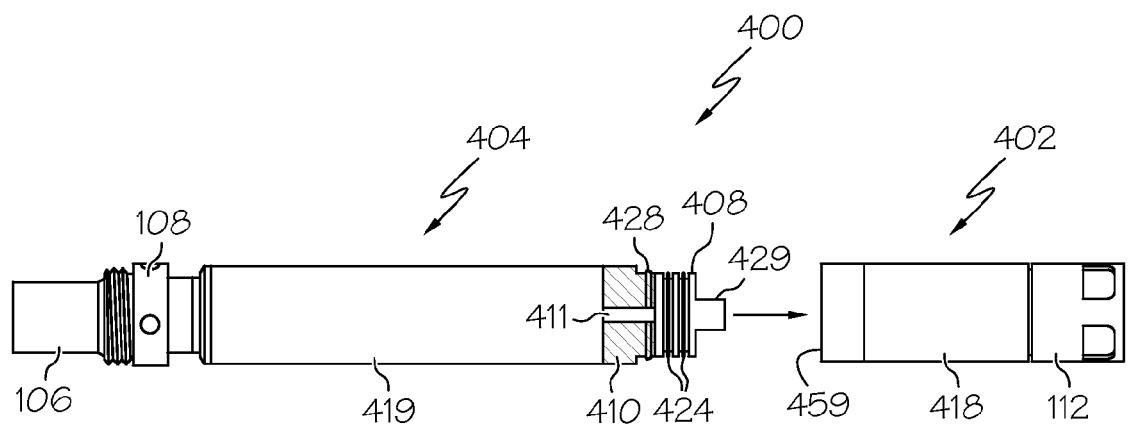
FIG. 15 is an exploded assembly view of one embodiment of a probe.

Referring now to FIG. 15, in another embodiment, a probe, generally designated 400, has a probe body 404 including an insertable male end 408 having a first electrical connector therein and a coupling member 410 positioned to detachably couple the probe body 404 to a probe head 402. The first electronic connector may be similar to those described above for FIGS. 3-6. The insertable male end 408 may be part of the probe body second housing 419', and, in one embodiment, is integral with the second housing 419. In another embodiment, the insertable male end 408 is a separate component attached to housing 419. The insertable male end 408 may also include one or more sealing members, such as O-rings 424 and an alignment tab 429. The coupling member 410, as shown, is an open flexible ring having a slot 411 and a snap-fit feature 428. The open flexible ring 410 may also have any of the features described above. The probe 400 may also include a connector 106 and threaded collar 108, similar to those described above. The probe body 404 also includes electronics, for example, a circuit board, housed within the second housing 419 to communicate with the sensor in the probe head 402.

The probe head 402 has a first housing 418 that houses a sensor and a second electrical connector. The first housing 418 includes a female end 459 for receiving the male end 408 of the probe body 404. The second electrical connector is preferably positioned in the female end 459 so that the sensor in the probe head 402 can be electrically coupled to the electronics in the probe body 404. The female end 459 and the second electrical connector may be similar to those described above for the probe body of FIGS. 10-12.

When comparing the embodiments of FIGS. 2 and 15, the embodiment of FIG. 2 may be preferable because it may be easier to replace the probe head having the coupling member and O-rings rather than replacing the O-rings on the probe body. The O-rings may wear or break after a plurality of uses. Wear on the O-rings may prevent the O-rings from providing a watertight seal. Accordingly, the O-rings may need to be changed each time the probe head is replaced in the embodiment of FIG. 15.

In another embodiment, the probe may be mounted within a multi-probe assembly or sonde as illustrated in U.S. Pat. No. 6,779,383 and wiped with a wiper element that cleans not only the disclosed probe 100, but other sensors in other probes.

It will be appreciated that while the invention has been described in detail and with reference to specific embodiments, numerous modifications and variations are possible without departing from the spirit and scope of the invention as defined by the following claims.

What is claimed is:

1. A sensor-containing probe head that is detachable from a probe body containing electronics and acting as an intermediate connecting the sensor-containing probe head to a sonde, the sensor-containing probe head comprising:
   a housing defining a watertight enclosure, having a first end detachably connectable to the probe body, and enclosing the following:
      an ion selective electrode as a sensor, the sensor having a portion thereof exposed to a surrounding environment;
      a reagent reservoir for the sensor;
      an electrical connector electrically connected to the ion selective electrode and having a portion thereof accessible for electrical connection to the electronics in the probe body;
      a reference electrode; and
      a sensor interface circuit electrically connected between the ion selective electrode and the electrical connector, the sensor interface circuit comprising:
         an operational amplifier having a voltage follower receiving a raw signal representative of a sensor reading from the ion selective electrode and outputting an amplified signal to a first coupling member of the electrical connector; and
         an input power portion electrically connected to a second coupling member of the electrical connector to receive input voltage from the probe body and having a grounded connection;
      wherein the reference electrode is electrically connected to a third coupling member of the electrical connector as a pass through to the electronics in the probe body;
      wherein reagent within the reagent reservoir is consumable and once exhausted, the sensor-containing probe head is detachable from the probe body for replacement with a probe head comprising an unexhausted reagent reservoir while the probe body containing the electronics remains unchanged.

2. The probe head of claim 1 wherein at least one of the probe head and the probe body includes a coupling member positioned to detachably connect the probe head and the probe body to one another, wherein the coupling member provides a watertight seal between the probe head and the probe body and includes a flexible open ring that includes a snap-fit feature.

3. The probe head of claim 2 wherein the flexible open ring is compressible to disengage the coupling member from the probe body such that the probe head is detachable from the probe body.

4. The probe head of claim 1 wherein the raw signal representative of a sensor reading is a raw pH reading.

5. The probe head of claim 1 further comprising a second working electrode, the second working electrode electrically coupled directly to the electrical connector to pass through the raw signal representative of the second working electrode's reading to the electronics of the probe body.

6. The probe head of claim 5 wherein the probe head is connected to the probe body and the electrical connector is a multi-pin connector having a third coupling connected to ground, a fourth coupling member receiving a voltage reference signal from the electronics in the probe head and a fifth coupling member connected directly to the second working electrode.

7. The probe head of claim 1 wherein the probe head is connected to the probe body and the electrical connector is a multi-pin connector having a third coupling member connected to ground, and a fourth coupling member receiving a voltage reference signal from the electronics in the probe head.

8. A sensor-containing probe for monitoring a parameter of an environment, the probe comprising:
   a probe head according to claim 1;
   a probe body enclosing electronics that are electrically coupled to a second electrical connector connectable to the electrical connector of the probe head and a third electrical connector connectable to a sonde; and
   wherein the electrical connector of the probe head and the second electrical connector of the probe body are electrically connected to one another to electrically couple the sensor of the probe head to the electronics of the probe body.

9. The probe of claim 8 wherein the probe head and probe body are detachably connected by the first electrical connector and the second electrical connector.

10. The probe of claim 9 wherein at least one of the probe head and the probe body includes a coupling member positioned to detachably connect the probe head and the probe body to one another, wherein the coupling member provides a watertight seal between the probe head and the probe body.

11. The probe of claim 10 wherein the coupling member includes a flexible open ring including a snap-fit feature.

12. The probe of claim 8 wherein the third electrical connector is a wet mateable connector.

13. The probe head of claim 8 wherein the raw signal representative of a sensor reading is a raw pH reading.

14. The probe head of claim 8 further comprising a second working electrode, the second working electrode electrically coupled directly to the electrical connector to pass through the raw signal representative of the second working electrode's reading to the electronics of the probe body.

15. The probe head of claim 14 wherein the second electrical connector is a multi-pin connector having a third coupling member connected to ground, a fourth coupling member receiving a voltage reference signal from the electronics in the probe head, and a fifth coupling member connected directly to the second working electrode.

16. The probe head of claim 8 wherein the second electrical connector is a multi-pin connector having a third coupling member connected to ground, and a fourth coupling member receiving a voltage reference signal from the electronics in the probe head.

17. A system comprising:
   a sensor head detachably connectable to a sonde through a probe body, as an intermediate member, that is detachably connectable directly to both the sensor head and the sonde;
   the sonde comprising:
      a port for receiving and electrically connecting the probe body thereto;
   the probe body comprising:
      a housing defining a watertight cavity enclosing a circuit board therein;
      a first electrical connector connected to the circuit board and accessible for detachably connecting to the sonde;
      a second electrical connector connected to the circuit board and accessible for detachably connecting to the probe head;
   the sensor head comprising:
      an electrode as a sensor having a portion thereof exposed to a surrounding environment;
      a reagent reservoir for the sensor enclosed within the sensor head;
      a third electrical connector matable to the second electrical connector of the probe body;
      a sensor interface circuit connecting the sensor to the third electrical connector,
   the sensor interface circuit having an operational amplifier with a voltage follower receiving raw signal representative of a sensor reading and an input power portion receiving input voltage, with a grounded connection.

18. The system of claim 17 wherein at least one of the sensor head and the probe body includes a coupling member positioned to detachably connect the sensor head and the probe body to one another when the second and third electrical connectors are mated together, wherein the coupling member provides a watertight seal between the sensor head and the probe body.

19. The system of claim 18 wherein the coupling member includes a flexible open ring including a snap-fit feature.

20. The system of claim 17 wherein the input power portion is connected to a ground-shield that shields leads between the electrode and the operational amplifier.

* * * * *